United States Patent
Satoh

(10) Patent No.: US 8,040,148 B2
(45) Date of Patent: Oct. 18, 2011

(54) SYSTEM IN PACKAGE WITH BUILT-IN TEST-FACILITATING CIRCUIT

(75) Inventor: Masayuki Satoh, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 457 days.

(21) Appl. No.: 12/092,238

(22) PCT Filed: Nov. 2, 2005

(86) PCT No.: PCT/JP2005/020193
§ 371 (c)(1),
(2), (4) Date: Apr. 30, 2008

(87) PCT Pub. No.: WO2007/052344
PCT Pub. Date: May 10, 2007

(65) Prior Publication Data
US 2010/0065846 A1  Mar. 18, 2010

(51) Int. Cl.
G01R 31/02 (2006.01)
H01L 21/48 (2006.01)
H01L 23/498 (2006.01)

(52) U.S. Cl. ........ 324/754.03; 324/756.02; 324/763.01; 257/E21.503; 257/E23.006; 257/E23.077; 257/E23.112; 438/115; 438/118

(58) Field of Classification Search .......... 324/761, 324/158.1; 257/E21.503, E23.006, E23.077, 257/E23.112; 438/115, 118
See application file for complete search history.

(56) References Cited

U.S. PATENT DOCUMENTS

| | | | | |
|---|---|---|---|---|
| 5,000,697 A | * | 3/1991 | Murphy | ........................ 439/331 |
| 5,517,515 A | | 5/1996 | Spall et al. | |
| 5,919,329 A | * | 7/1999 | Banks et al. | .................. 156/281 |
| 6,859,054 B1 | * | 2/2005 | Zhou et al. | ..................... 324/754 |
| 2002/0003429 A1 | * | 1/2002 | Wiggin et al. | ................. 324/761 |
| 2003/0113944 A1 | * | 6/2003 | Kanamaru et al. | .............. 438/14 |
| 2004/0239349 A1 | * | 12/2004 | Yamagishi et al. | ........... 324/754 |
| 2005/0225315 A1 | * | 10/2005 | Goldsmith et al. | ........ 324/158.1 |

FOREIGN PATENT DOCUMENTS

JP  08-068832 A  3/1996
JP  08-101255 A  4/1996

OTHER PUBLICATIONS

Notice of Reasons for Rejection, dated Jun. 14, 2011, issued by the Japanese Patent Office in Japanese Patent Application No. 2007-542193, which is the national phase patent application of PCT/JP2005/020193.

* cited by examiner

Primary Examiner — Zandra Smith
Assistant Examiner — Tsz K Chiu
(74) Attorney, Agent, or Firm — Law Office of Katsuhiro Arai

(57) ABSTRACT

This invention relates to a system in package including a plurality of integrated circuit chips and a substrate on which the plurality of integrated circuit chips are mounted and characterized in that a testability circuit for facilitating a test on at least one of the integrated circuit chips is incorporated into the substrate. The testability circuit incorporated into the substrate is formed by embedding a so-called WLCSP integrated circuit chip into the substrate. Alternatively, the testability circuit is formed by using a transistor element formed by using a semiconductor layer formed on the substrate. By incorporating the testability circuit into the substrate as described above, it is possible to realize a system in package facilitated in test without increases in size and cost.

14 Claims, 8 Drawing Sheets

[Fig. 1]
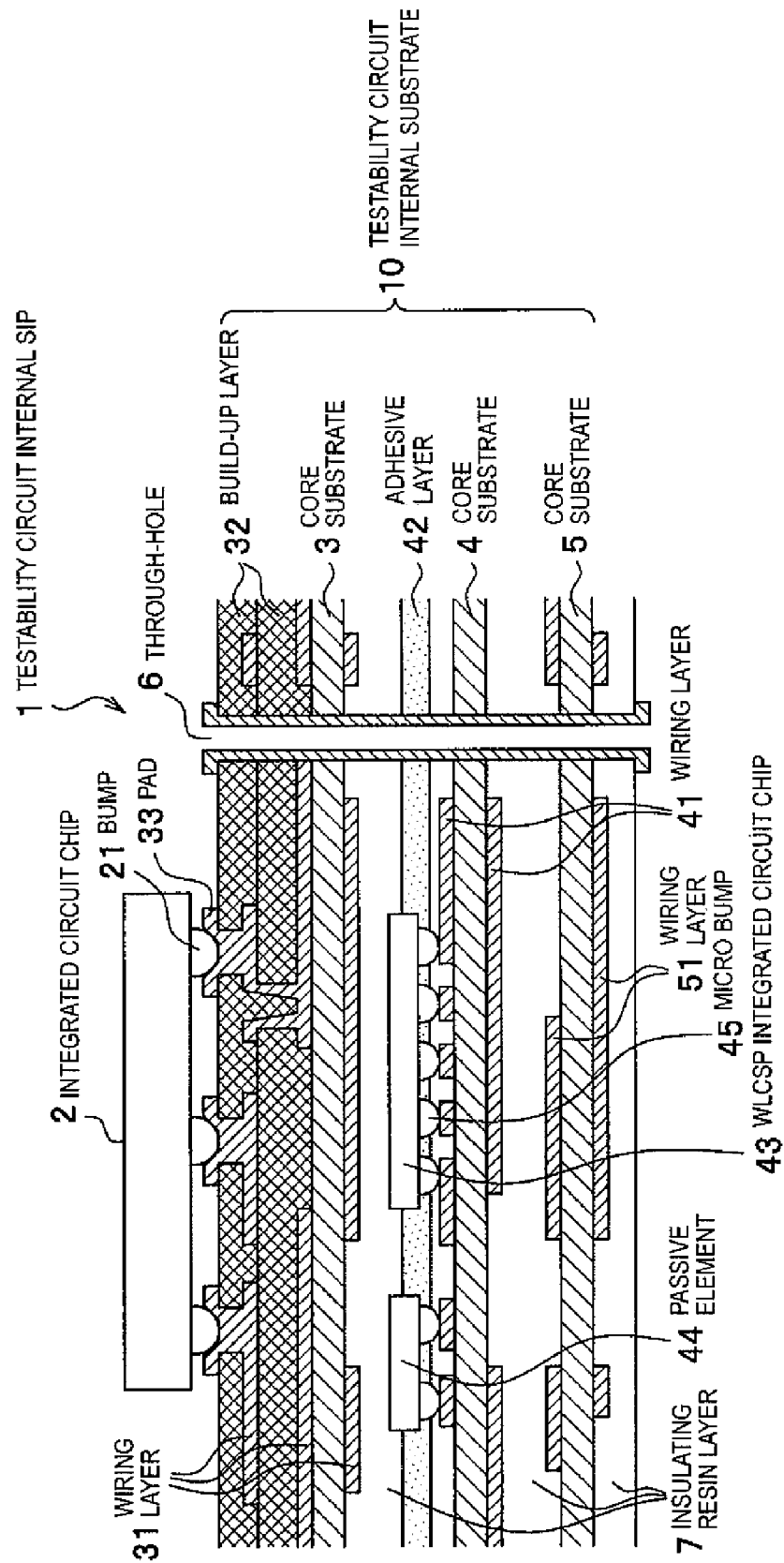

[Fig. 2]
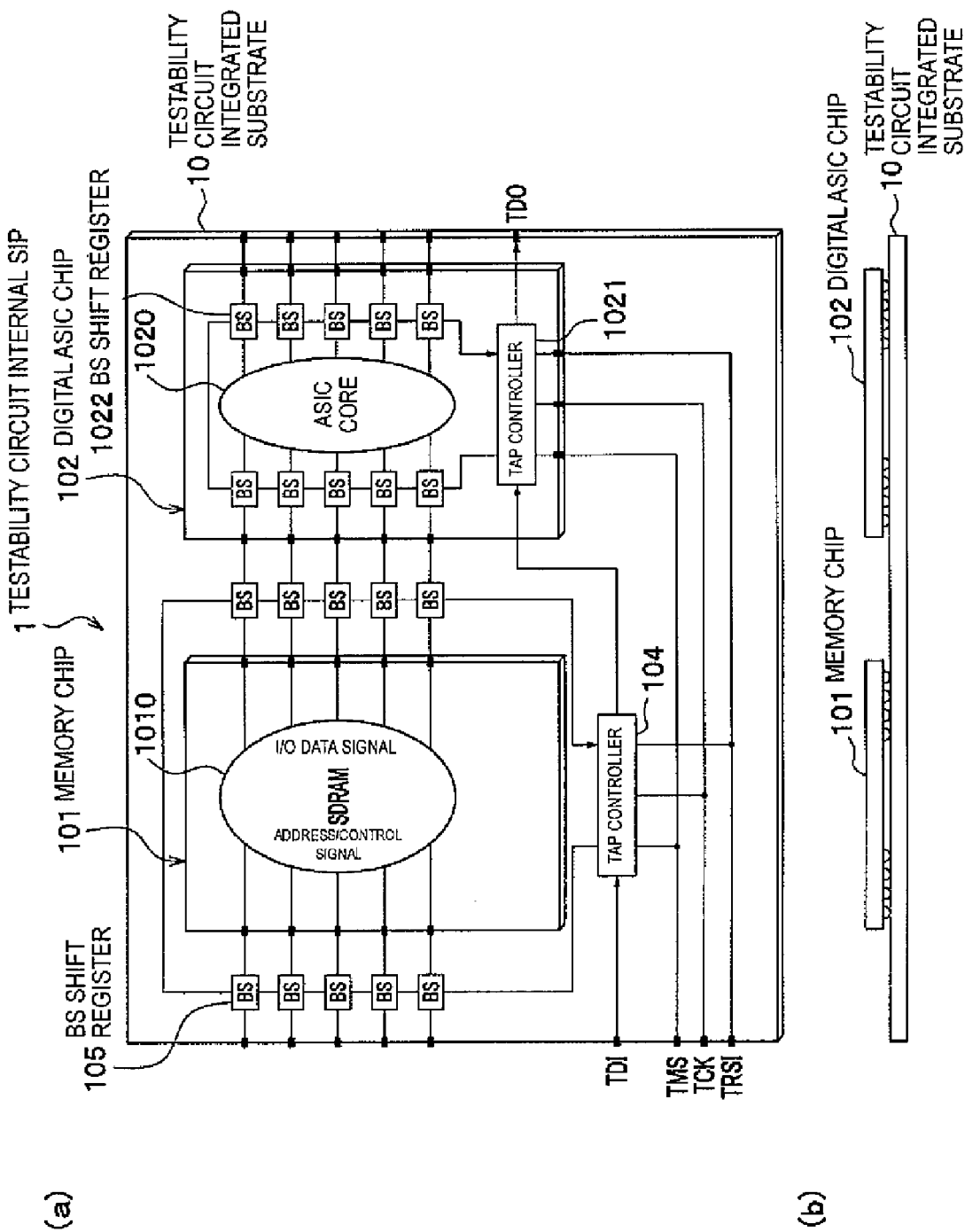

[Fig. 3]
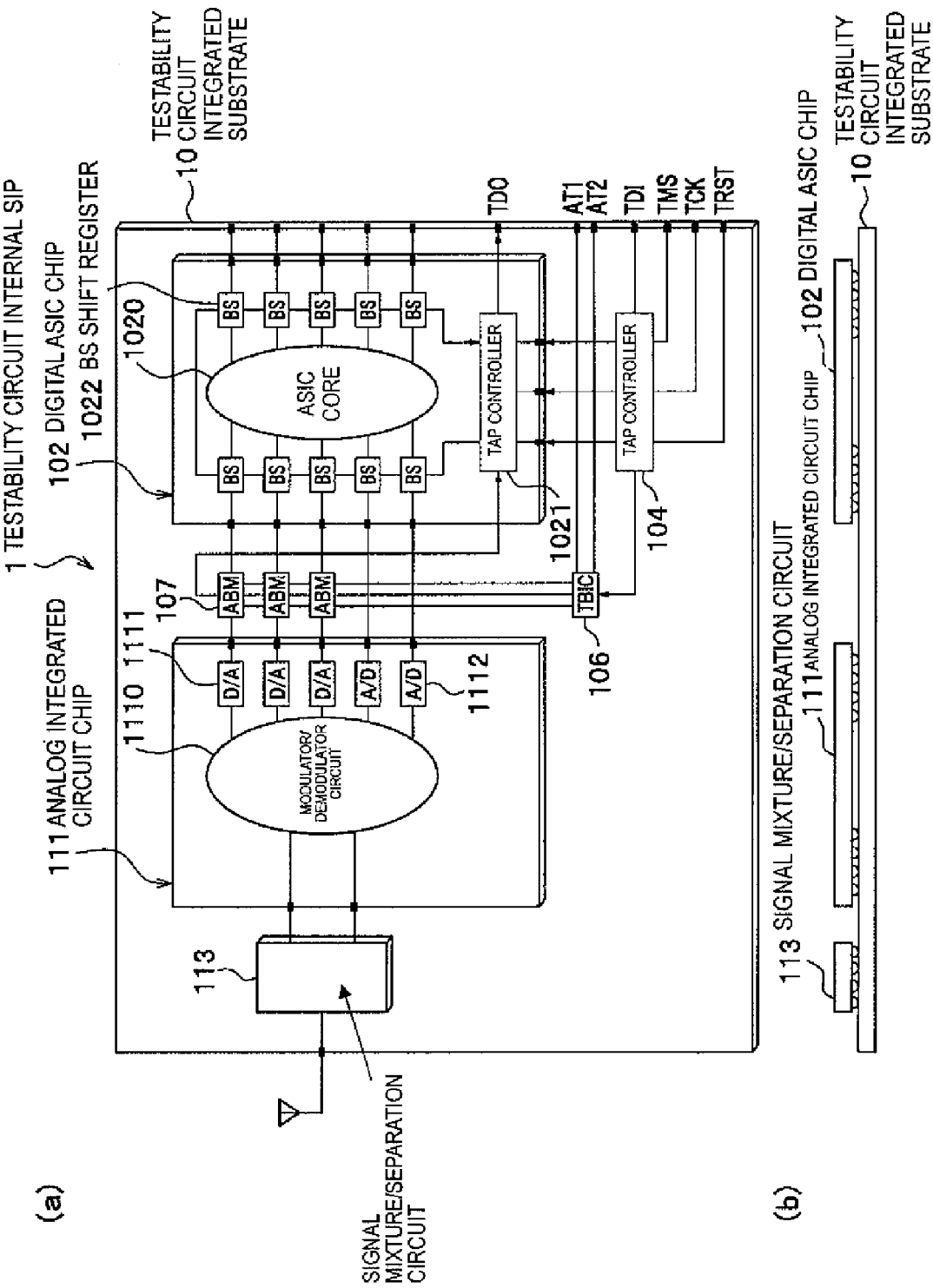

[Fig. 4]
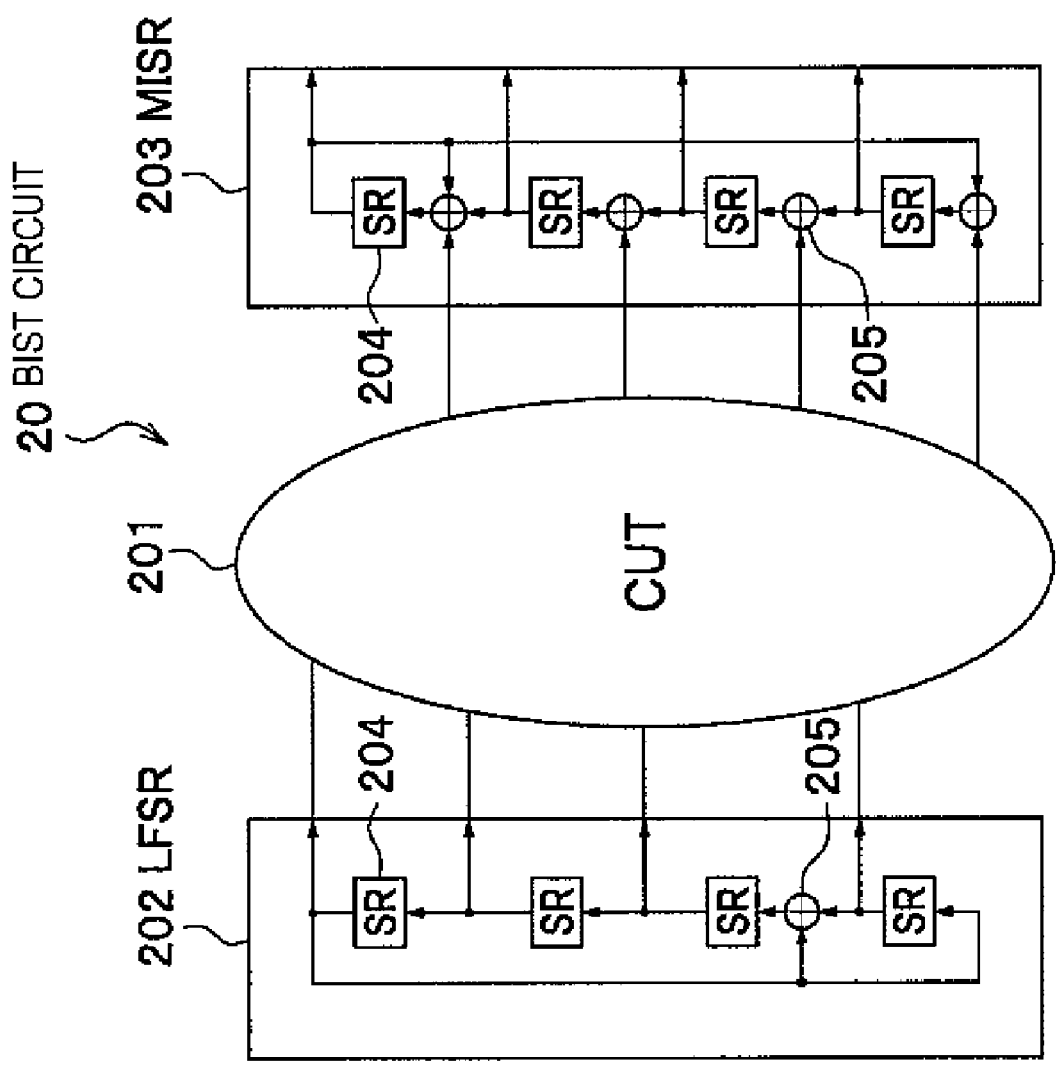

[Fig. 5]
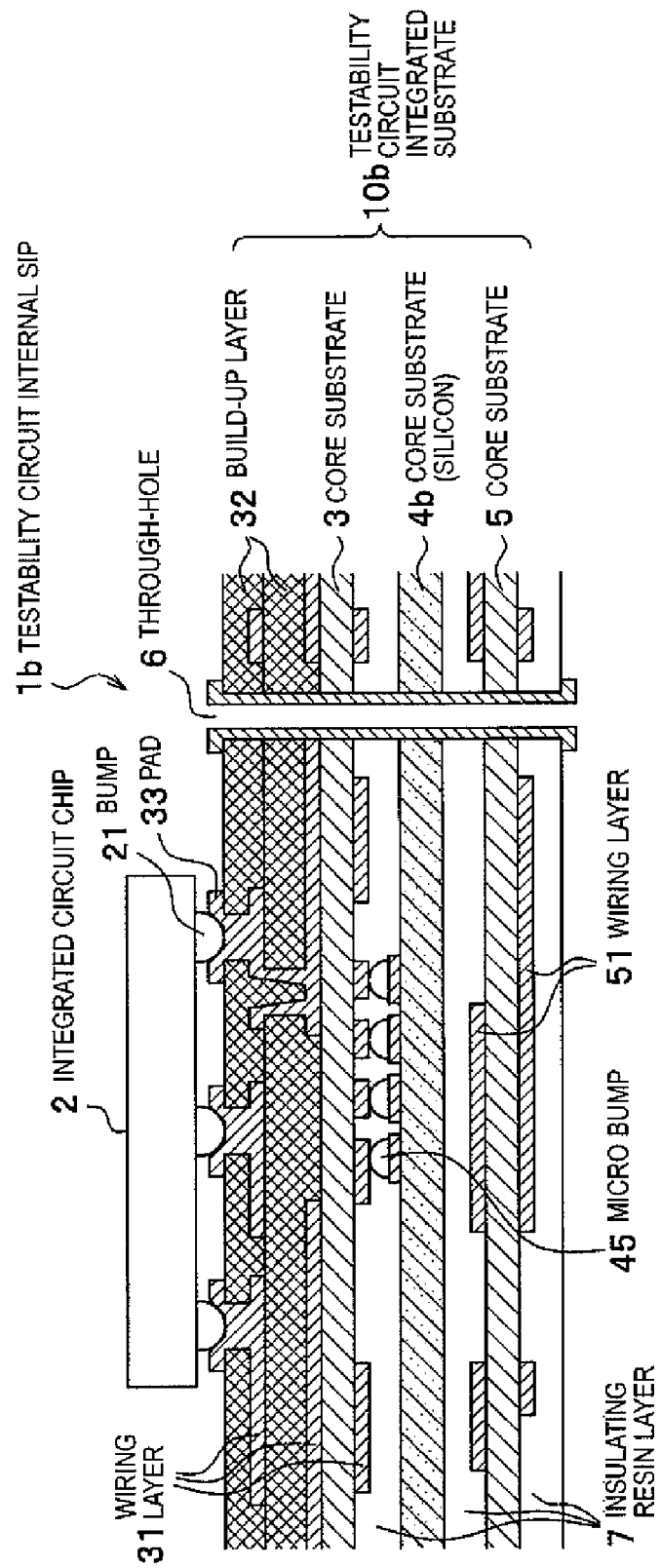

[Fig. 6]
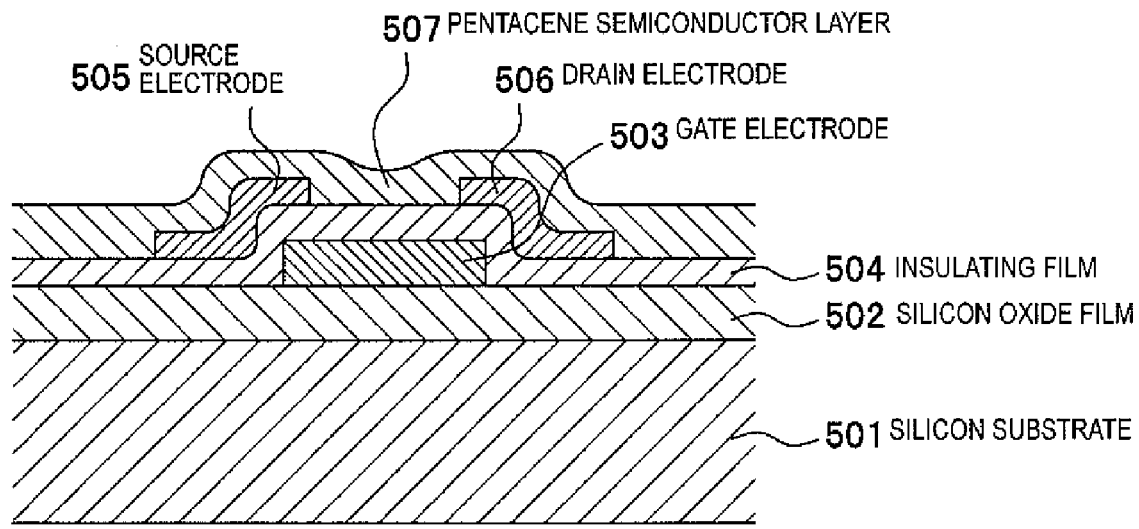
[Fig. 7]
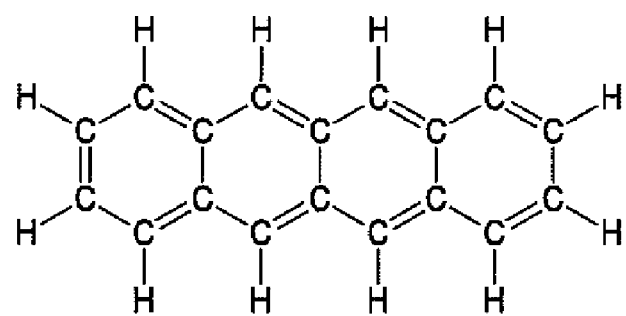

[Fig. 8]
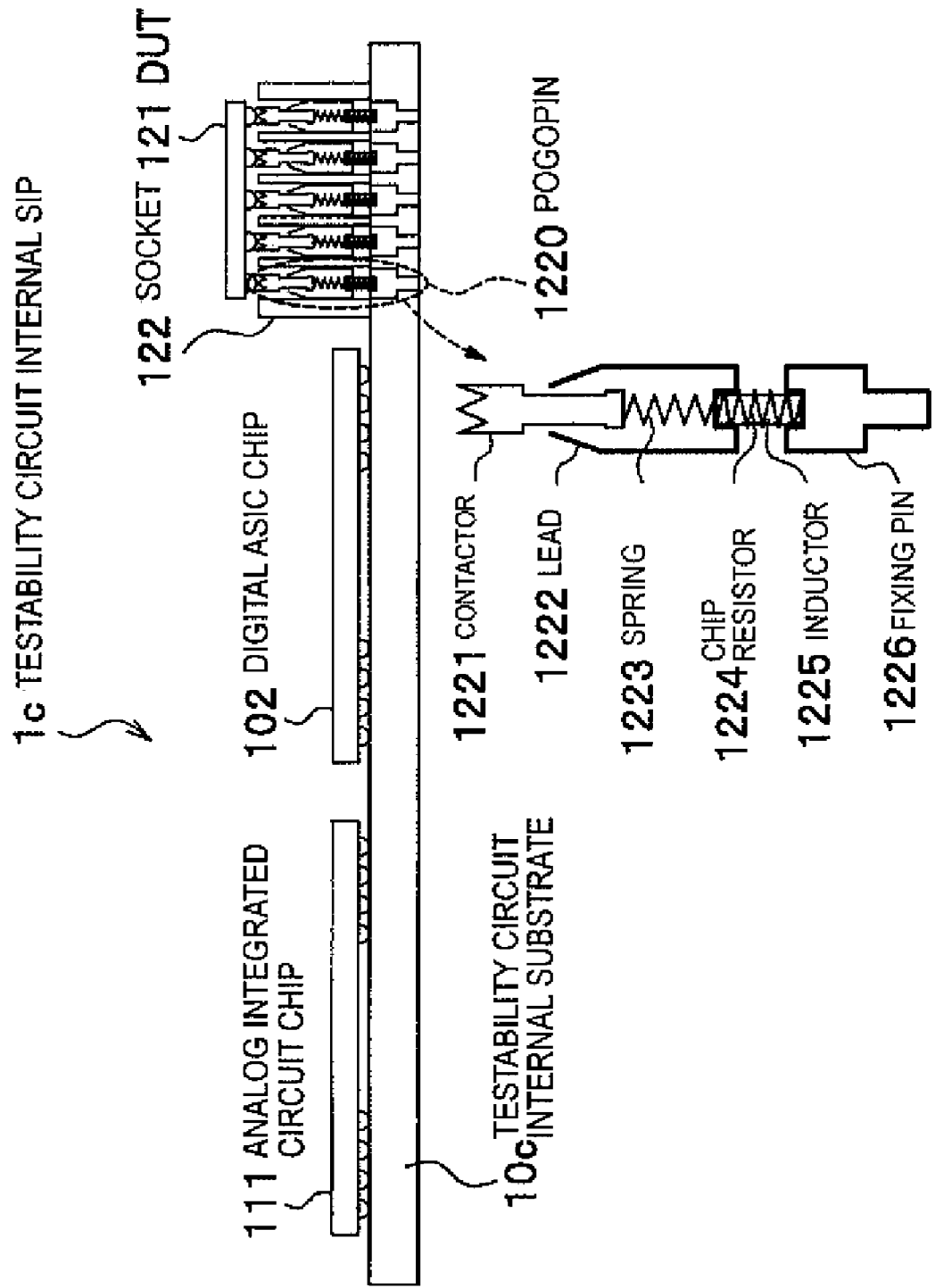

[Fig. 9]
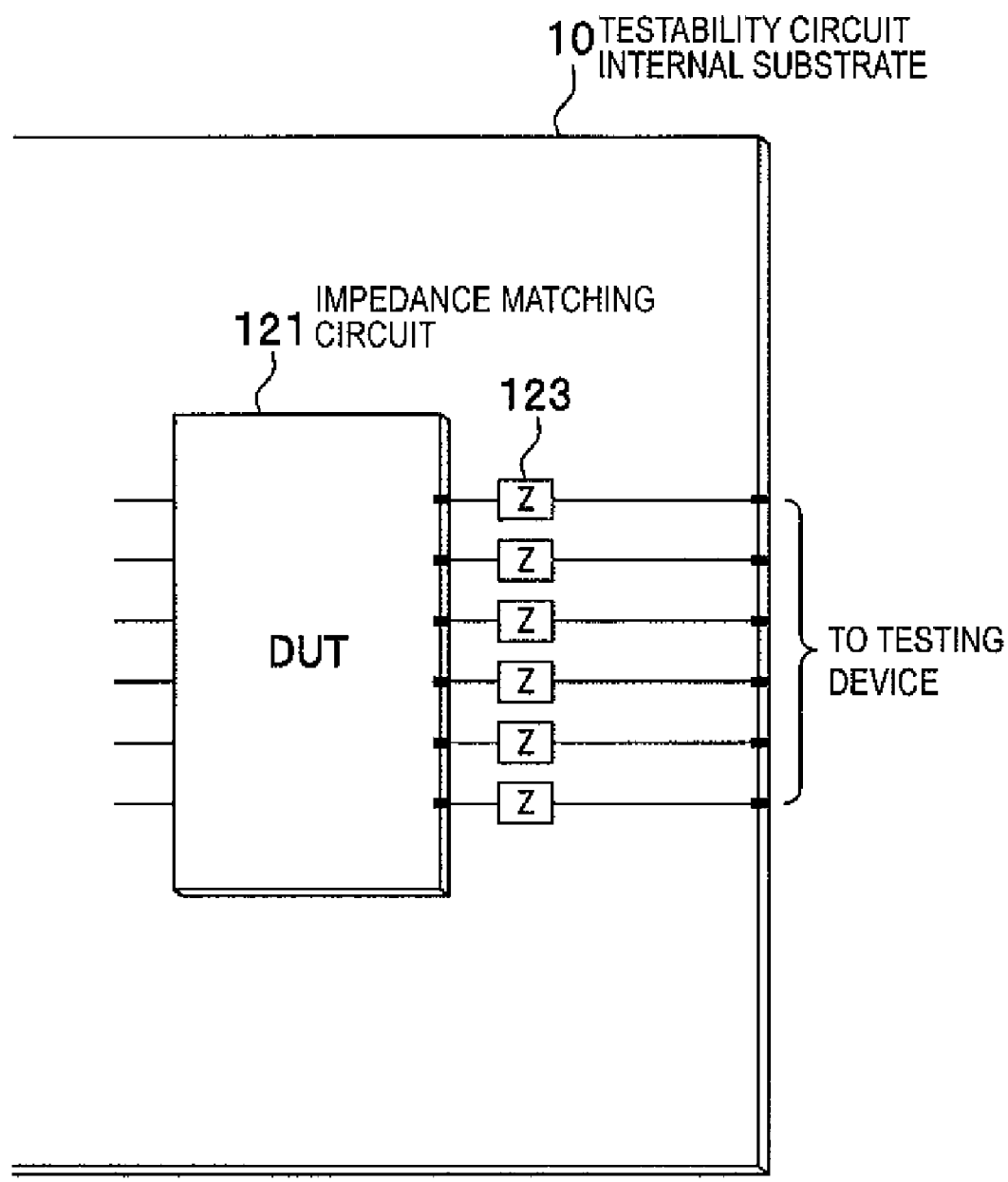

SYSTEM IN PACKAGE WITH BUILT-IN TEST-FACILITATING CIRCUIT

BACKGROUND OF THE INVENTION

1. Field of the Invention

This invention relates to a system in package (hereinafter abbreviated to SIP) having a testability circuit interior substrate and/or an impedance matching circuit mounted on its substrate and to a socket used in the system in package.

2. Description of the Related Art

Integration technology for semiconductor integrated circuit has considerably progressed in recent years, and a large scale integration circuit that realizes a plurality of circuit devices as one integration circuit chip, which is called SOC (System On Chip), has been put into practical use. The SOC often includes a large capacity memory and a logic circuit such as a processor operating at a high speed. In order to manufacture the SOC, an insulating layer of a material having large permittivity is formed for downsizing the memory cell is formed, and an insulating layer of a material having small permittivity for realizing the high speed operation of the logic circuit such as the processor is formed. Therefore, the SOC manufacture process is complicated, and it is difficult to improve yield of the manufacture process, thereby making it difficult to reduce the SOC manufacture cost lower than a certain level.

Accordingly, an SIP that is obtained by producing each of a plurality of circuit devices forming the SOC as an integrated circuit chip and mounting the integrated circuit chips on one package is attracting attention.

One of the advantages of the SIP is that it is possible to produce the SIP by assembling integrated circuit chips that have been produced. In this case, since the integrated circuit chips to be used are those that have been produced, they are available at low prices.

Also, in the case of producing a newly developed integrated circuit chip to be mounted on the SIP, it is possible to produce each of the memory and the logic circuit, for example, as a separate integrated circuit chip. Therefore, since it is possible to produce each of the integrated circuit chips by a minimum process step, it is possible to independently improve the yield of each of the integrated circuit chips. Consequently, even when a cost for assembling a plurality of chips as one package is taken into consideration, it is possible to produce the SIP at a low cost as compared to the production cost of the SOC in which the integrated circuit chips are integrated on a silicon chip of the identical type.

However, in an SIP (or in an SOC), there is a problem that it is difficult to perform a test on the integrated circuit chips since a signal conductor for connecting the integrated circuit chips mounted on the SIP is not connected to an external connection terminal of the SIP. For example, it is possible to perform a test on a memory integrated circuit chip when all terminal signals of the memory integrated circuit chip are controlled and observed by an external device such as a testing device. Accordingly, in the case where the terminal signals of the memory integrated circuit chip are connected only to other internal integrated circuit chips and not connected to the external connection terminal of the SIP, it is impossible to perform the test on the memory integrated circuit chip.

In recent years, a testability circuit interior substrate such as a boundary scanning circuit that is normalized by JTAG (Joint Test Action Group) is provided in some cases in an integrated circuit chip. In such case, the test on the integrated circuit chip is facilitated. However, many of those that have heretofore been on the market as a general-purpose component, particularly the memory integrated circuit chip, for example, are not provided with such testability circuit interior substrate. The integrated circuit chip to be mounted on the SIP is usually supplied as a baring die (in this specification, the baring die means an integrated circuit obtained by dicing a wafer, and the integrated circuit means the baring die that is mounted in a package). Therefore, it is necessary to develop a strategy for facilitating the test by taking the above-described reality into consideration when designing and producing an SIP.

As to the problem of difficulty in conducting the test on the SIP, Patent Document 1 described below discloses a technology for facilitating a test on an SIP by forming a circuit for assisting a test on a first integrated circuit chip (e.g. memory integrated circuit) mounted on the SIP on a second integrated circuit chip mounted on the same SIP. Also, Patent Document 2 described below discloses a technology of facilitating a test on an SIP by mounting an integrated circuit chip formed of an FPGA (Field Programmable Gate Array) in addition to integrated circuit chips to be mounted on the SIP, and forming a testability circuit interior substrate using the integrated circuit chip of FPGA.

Patent Document 1: JP-A-2004-158098 (paragraphs 0009 to 0021 and FIGS. 1 to 3)

Patent Document 2: JP-A-2005-283205 (paragraphs 0015 to 0021 and FIGS. 1 and 2)

Further, it is necessary to consider measures against reflection of signals in the integrated circuit chip terminals in such SIPs. Many of recent integrated circuit chips operate at a clock frequency that is in a GHz band. In the case where the signal reflection measure is not taken when mounting the integrated circuit chip of the high speed operation on the SIP, it is difficult to accurately perform the high speed signal transmission due to the signal reflection caused by impedance mismatching.

In the technology disclosed in Patent Document 1, in the case of performing a test on an integrated circuit chip, an auxiliary circuit for the test is added to another integrated circuit chip. Therefore, it is impossible to use any existing integrated circuit as the another integrated circuit chip. In such case, since it is necessary to produce an integrated circuit chip dedicated to the SIP, the cost advantage of SIP is impaired. Also, in the technology disclosed in Patent Document 2, since an integrated circuit chip of an extra FPGA is added to an SIP, the size and the cost of the SIP are undesirably increased.

As to the signal reflection measure in the integrated circuit chip terminal, it is possible to prevent the signal reflection by adding resistance and inductance elements for impedance matching in the vicinity of the terminal of the integrated circuit chip. However, when such technology is applied to the SIP, a space for mounting the resistance and inductance elements is required to cause a disadvantage of increasing the size of SIP.

SUMMARY OF THE INVENTION

In view of the problems of the conventional technologies, an object of this invention is to provide an SIP that is not increased in size when an integrated circuit chip not including a testability circuit is mounted and is capable of facilitating a test without incurring a large increase in production cost as well as to provide an SIP enabling prevention of signal reflection in a terminal of an integrated circuit chip to be mounted.

In order to attain the object, the invention according to claim 1 provides an SIP comprising a plurality of integrated circuit chips and a substrate on which the plurality of integrated circuit chips are mounted, wherein a testability circuit is incorporated into the substrate in order to facilitate a test on at least one of the integrated circuit chips. The incorporation of the testability circuit into the substrate means a production of the substrate by embedding the testability circuit integrally with the substrate during a process of producing the substrate.

According to the invention of claim 1, in the case where an integrate circuit chip forming the SIP does not include any testability circuit, the testability circuit for the integrated circuit chip is incorporated into the substrate on which the integrated circuit chip is to be mounted, thereby making it possible to facilitate the test on the integrated circuit chip and, ultimately, tests on the whole SIP including the integrated circuit chip by slightly or never increasing the size of the SIP.

The invention according to claim 2 provides the SIP according to claim 1, wherein the testability circuit incorporated into the substrate is a boundary scanning circuit. The invention according to claim 3 provides the SIP according to claim 1, wherein the testability circuit incorporated into the substrate is a built-in self-test circuit.

The boundary scanning circuit and the built-in self-test circuit have heretofore been actively studied as a testability circuit that is applicable to systematic and is normalized by JTAG and the like. Also, a DA (Design Automation) tool or a CAD (Computer Aided Design) tool for applying the testability circuit to an ingenerated circuit or the like has been created. Therefore, it is possible to easily apply the boundary scanning circuit and the built-in self-test circuit to the SIP. That is, according to the invention recited in claim 2 or 3, it is possible to reliably facilitate the test on SIP without much time and effort.

The invention according to claim 4 provides the SIP according to claim 3, wherein at least a part of the built-in self-test circuit incorporated into the substrate is formed of a programmable circuit element.

According to the invention of claim 4, since at least a part of the built-in self-test circuit is formed of the programmable circuit element, it is possible to change a length of LFSR (Linear Feedback Shift Register) which is one of components of the built-in self-test circuit and a generated data pattern length thereof. That is, it is possible to perform a built-in self-test appropriately adapted to a circuit configuration of the integrated circuit chip forming the SIP.

The invention according to claim 5 provides the SIP according to claim 1, wherein a WLCSP (Wafer Level Chip Size Package) integrated circuit chip is embedded into the substrate, and the testability circuit incorporated into the substrate is formed by connecting the embedded WLCSP integrated circuit chip by way of a wiring of a wiring layer included in the substrate.

According to the invention of claim 5, since it is possible to form the testability circuit by using the WLCSP integrated circuit chip which is a commercially available standard logic integrated circuit, it is possible to produce the SIP at an inexpensive cost.

The invention according to claim 6 provides the SIP according to claim 1, wherein at least one layer of the substrate is formed of a semiconductor layer, the semiconductor layer is used for forming a transistor element, and the testability circuit is formed by connecting the transistor element by way of a wiring of a wiring layer included in the substrate. The invention according to claim 7 provides the SIP according to claim 6, wherein the semiconductor layer is a silicon semiconductor layer. Also, the invention according to claim 8 provides the SIP according to claim 6, wherein the semiconductor layer is an organic compound semiconductor layer.

According to the invention recited in anyone of claims 6 to 8, at least one semiconductor layer is formed on the substrate, a transistor element such as a MOS (Metal Oxide Semiconductor) is formed by using the semiconductor layer, and the testability circuit is formed by connecting the transistor element such as the MOS by using a wiring. Since the transistor element such as the MOS is an element that is far smaller than the WLCSP integrated circuit chip, it is possible to produce the SIP that is more compact in size.

In the case where the semiconductor layer is a silicon semiconductor, since it is possible to employ a conventional silicon semiconductor production process for various circuit devices such as a resistor, an inductance, and a nonvolatile memory device without limitation to the transistor element, it is possible to produce a testability circuit having a complicated circuit configuration. Also, it is possible to readily form apart of the testability circuit by a so-called programmable element such as a PLD (Programmable Logic Device).

The invention according to claim 9 provides the SIP according to claim 1, wherein a passive device connected to a terminal of the integrated circuit chip for matching impedance of the terminal is incorporated into the substrate.

According to the invention of claim 9, since the passive device for matching impedance of the terminal of the integrated circuit chip forming the SIP, such as an element formed of a resistor and an inductance, is incorporated into the substrate, it is possible to prevent signal reflection in the terminal of the integrated circuit chip without increasing the size of SIP.

The invention according to claim 10 provides the SIP according to claim 1, wherein a socket to which an integrated circuit chip other than the integrate circuit chip mounted as being fixed on the substrate is detachably attached is mounted on the substrate.

According to the invention of claim 10, it is possible to realize a test SIP for testing an integrated circuit chip to be tested by attaching the integrated circuit chip to be tested to the socket.

The invention according to claim 11 provides the SIP according to claim 10, wherein a passive device for matching impedance of a terminal of the integrated circuit chip attached to the socket is incorporated into a pogopin of the socket for connecting the terminal of the integrated circuit chip attached to the socket and the wiring layer of the system in package substrate to each other.

According to the invention of claim 11, since the passive device for matching impedance of the terminal of the integrated circuit chip attached to the socket mounted on the SIP substrate is incorporated into the pogopin of the socket, it is possible to prevent the signal reflection in the terminal of the integrated circuit chip attached to the socket without increasing the size of SIP.

The invention of claim 12 provides a socket to which an integrated circuit chip is attached, wherein a passive device for matching impedance of a terminal of the integrated circuit chip attached to the socket is incorporated into a pogopin of the socket.

According to the invention of claim 12, it is possible to prevent signal reflection in the terminal of the integrated circuit chip attached to the socket.

As described above, it is possible to realize the SIP that is facilitated in testing without increases in size and production cost when an existing integrated circuit chip not including a testability circuit is mounted thereon. Also, it is possible to prevent signal reflection in a terminal of the integrated circuit mounted on the SIP.

BRIEF DESCRIPTION OF THE DRAWINGS

FIG. 1 is a diagram schematically showing a sectional structure of a testability circuit internal substrate forming a testability circuit internal SIP according to a first embodiment of this invention.

FIG. 2 are diagrams showing a first example of the testability circuit internal SIP according to the first embodiment of this invention, wherein (a) is the diagram schematically showing a planar shape and a circuit, and (b) is the diagram schematically showing a sectional shape.

FIG. 3 are diagrams showing a second example of the testability circuit internal SIP according to the first embodiment of this invention, wherein (a) is the diagram schematically showing a planar shape and a circuit, and (b) is the diagram schematically showing a sectional shape.

FIG. 4 is a diagram showing one example of structure of a generally used BIST circuit.

FIG. 5 is a diagram schematically showing a sectional structure of a testability circuit internal substrate forming a testability circuit internal SIP according to a second embodiment of this invention.

FIG. 6 is a diagram showing one example of structure wherein an organic compound semiconductor is formed on a core substrate of the testability circuit internal SIP according to the second embodiment of this invention.

FIG. 7 is a diagram showing a chemical structure of a pentacene molecule.

FIG. 8 is a diagram schematically showing a sectional structure of a testability circuit internal SIP according to a third embodiment of this invention.

FIG. 9 is a diagram wherein a point of a circuit for connecting a DUT to a testing device in the testability circuit internal SIP according to the third embodiment of this invention.

DESCRIPTION OF THE PREFERRED EMBODIMENTS

Hereinafter, embodiments of this invention will be described in detail by using the drawings.

First Embodiment

FIG. 1 is a diagram schematically showing a sectional structure of a testability circuit internal substrate forming a testability circuit internal SIP according to a first embodiment of this invention. As shown in FIG. 1, the testability circuit internal SIP 1 according to the first embodiment is generally formed by mounting a plurality of integrated circuit chips 2 (one of them is shown in FIG. 1) on a testability circuit internal substrate 10. The testability circuit internal substrate 10 is formed by laminating a plurality of substrate cores 3, 4, and 5 on each of which a metal wiring layer 31, 41, or 51 is formed by using an insulating resin layer 7 made from a resin or the like.

Referring to FIG. 1, a so-called build-up layer 32 is formed on the core substrate 3, and a pad 33 made from a metal or the like is formed on an uppermost layer (outermost layer). The pad 33 is formed at a position receiving a bump 21 formed as a signal connection terminal of an integrated circuit chip 2, and the integrated circuit chip 2 and the testability circuit internal substrate 10 are connected to each other via the bump 21 and the pad 33. The connection of the wiring layers 31, 41, and 51 of the core substrates 3, 4, and 5 is achieved via a through-hole 6 or the like. The core substrate 3 may not have the build-up layer 32.

A WLCSP integrated circuit chip 43 having a length of about 1 to 2 mm, a width of about 0.5 mm, and a thickness of about 0.5 mm is mounted on the core substrate 4. The WLCSP integrated circuit chip 43 is an integrated circuit chip having a packaging style obtained by simply adding a micro bump 45 to a bearing die of the integrated circuit and includes a several logical circuit elements that are generally called standard logics. Therefore, the plural WLCSP integrated circuit chips 43 are appropriately connected by the wiring of the wiring layer 41 to separately form a testability circuit illustrated in FIGS. 2 and 3.

A passive element 44 such as a resistor, a capacitor, and an inductor having the size similar to that of the WLCSP integrated circuit chip 43 is mounted on the core substrate 4. The passive element 44 is used for forming the testability circuit when so required as well as for forming an impedance matching circuit for a terminal (bump 21) of the integrated circuit chip 2. Also, a so-called pass condenser or the like may be formed by the passive element 44 for stabilizing power source signals.

Since the WLCSP integrated circuit chip 43 and the passive element 44 are mounted on the core substrate 4, unevenness is formed on a surface of the core substrate 4. An adhesive layer 42 may be formed for reducing the unevenness and improving adhesion property to another core substrate.

In the above description of FIG. 1, it is described that the testability circuit internal substrate 10 is formed of the three core substrates 3, 4, and 5; however, the number of the core substrates is not particularly limited insofar as the number is one or more. In the case where the number of the core substrates is one, the integrated circuit chips 2 are generally mounted on one side, and the WLCSP integrated circuit 43 is mounted on the other side. Also, when the plural integrated circuit chips 2 are mounted on the testability internal circuit substrate 10, the integrated circuit chips 2 may be mounted on both of the sides of the testability circuit internal substrate 10, and the WLCSP integrated circuit chip 43 and the like may be mounted on the core substrate that is included in the testability circuit internal substrate 10.

FIG. 2 are diagrams showing a first example of the testability circuit internal SIP according to the first embodiment of this invention, wherein (a) is the diagram schematically showing a planar shape and a circuit, and (b) is the diagram schematically showing a sectional shape.

Referring to FIG. 2, the testability circuit internal SIP 1 is formed of a memory chip 101, a digital ASIC (Application Specific Integrated Circuit) chip 102, and the testability circuit internal substrate 10 on which the memory chip 101 and the digital ASIC chip 102 are mounted. The memory chip 101 includes an SDRAM (Synchronous Dynamic Random Access Memory) 1010, for example, and no testability circuit is included in the memory chip 101. In turn, a boundary scanning circuit, for example, which is of IEEE1149.1 standard normalized by JTAG is included in the digital ASIC chip 102 as a testability circuit for facilitating a test on an ASIC core 1020.

In this embodiment, the boundary scanning circuit of IEEE1149.1 standard is incorporated into the testability circuit internal substrate 10 for facilitating a test on the memory chip 101. As shown in FIG. 2, the boundary scanning circuit includes a BS shift register 105 provided in such a fashion as to surround the memory chip 101 and connected to a terminal of the memory chip 101, a TAP (Test Access Port) controller 104 for controlling a test operation by importing information inputted from the testing terminal, and the like.

The testing terminal is a signal terminal for controlling execution of a test performed by using the boundary scanning circuit. In the IEEE1149.1 standard of JTAG, a TDI (Test Data Input) for inputting test data, a TMS (Test Mode Select input) for selecting an operation at a test mode, a TCK for executing a test operation including a shift operation of the BSF shift register 105, a TRSI (Test Reset Input) for initializing an internal state of the TAP controller 104, and the like are defined as the testing terminals.

The Tap controller 104 is a control circuit for controlling the operation and the test operation of the boundary scanning circuit. Though detailed description of the operation is omitted in this specification, the test data are inputted into the memory chip 101 via the testing terminal TDI and the BS shift register 105, while test data of an operation result of the memory chip 101 are outputted to outside via the BS shift register 105 and the testing terminal TDO. As described above, it is possible to perform the test on the memory chip 101 even when the terminal of the memory chip 101 is not directly connected to the external terminal of the testability circuit internal SIP 1, i.e. the test is facilitated.

Since a BS shift register 1022 and a TAP controller 1021 have been installed into the digital ASI chip 102, the test is performed simply by connecting the testing terminal provided in the digital ASIC chip 102 to the testing terminal provided in the testability circuit internal substrate 10.

In this embodiment, the boundary scanning circuit described above, i.e. the testability circuit, is formed by appropriately connecting the plural WLCSP integrated circuit chips 43 incorporated into the testability circuit internal substrate 10 (see FIG. 1) by the wirings of the wiring layers 31, 41, and 51. Since the size of the WLCSP integrated circuit chip 43 is small as described above, the size of the testability circuit internal SIP 1 is slightly increased when such testability circuit is incorporated.

FIG. 3 are diagrams showing a second example of the testability circuit internal SIP according to the first embodiment of this invention, wherein (a) is the diagram schematically showing a planar shape and a circuit, and (b) is the diagram schematically showing a sectional shape.

In the example of FIG. 3, the memory chip 101 of the testability circuit internal SIP 1 in the example of FIG. 2 is replaced by an analog integrated circuit chip 111. In the analog integrated circuit chip 111, a modulator/demodulator circuit 1110 is formed in the analog integrated circuit chip 111. One input terminal and one output terminal of the modulator/demodulator circuit 1110 are connected to signals from an external antenna via a signal mixture/separation circuit 113. The other input terminal and the other output terminal are connected to external signals of the analog integrated circuit chip 111 via a D/A (Digital to Analog) converter 1111, an A/D (Analog to Digital) converter 1112, and the like.

In the case where the testability circuit integrated SIP 1 includes the analog integrated circuit chip 111, an analog consideration boundary scanning circuit of IEEE1149.4 standard normalized by JTAG is incorporated into the testability circuit internal substrate 10 in order to facilitate a test on the analog integrated circuit chip 111 as described above.

The analog consideration boundary scanning circuit includes a TPIC (Test Bus Interface Circuit) 106 and an ABM (Analog Boundary Module) 107 in addition to the ordinary TAP controller 104 and BS shift register 105 (not shown in FIG. 3). Though detailed descriptions of the TBIC 106 and the ABM 107 are omitted in this specification, the ABM 107 is connected to an analog input terminal or an analog output terminal of the analog integrated circuit chip 111 and operates in such a manner as to connect a signal from the analog input terminal or the analog output terminal to analog testing terminals AT1 and AT2 under the control of the TBIC 106.

That is, since it is possible to supply the analog testing signal to the analog integrated circuit chip 111 as well as to observe the analog signal outputted from the analog integrated circuit chip 111 via the analog testing terminals AT1 and AT2, a test on the analog integrated circuit chip 111, i.e. the test on the testability circuit internal SIP 1, is facilitated. The analog consideration boundary scanning circuit described above is formed by appropriately connecting the plural WLCSP integrated circuit chips 43 and the passive element 44 incorporated into the testability circuit internal substrate 10 (see FIG. 10) by the wirings of the wiring layers 31, 41, and 51.

Though the testability circuit that is formed by the boundary scanning circuit (IEEE 1149.1) or the analog consideration boundary scanning circuit (IEEE 1149.4) is described by way of example in the first embodiment of this invention, the testability circuit may be based on another method. For example, an BIST circuit (Built In Self-Test) circuit may be used in place of the boundary scanning circuit.

FIG. 4 is a diagram showing one example of structure of a generally used BIST circuit. As shown in FIG. 4, the BIST circuit 20 is formed of an LFSR (Linear Feedback Shift Register) 202 and an MISR (Multi Input Signature Register) 203. In a test by the BIST circuit 20, a pseudo-random number system generated by the LFSR 202 is inputted to a CUT (Circuit Under Test) 201, and a number system outputted by the CUT 201 in response to the input is subjected to information compression by the MISR 203. It is judged whether or not the CUT 201 has operated normally depending on whether or not the compressed information (signature) is the same as an expected signature.

When such BIST circuit 20 is adapted to the testability circuit internal SIP 1 of FIG. 2, the BS shift register 105 is replaced by the LFSR 202 and the MISR 203 since the memory chip 101 corresponds to the CUT 201. The LFSR 202 and the MISR 203 are formed by appropriately connecting the plural WLCSP integrated circuit chips 43 incorporated into the testability circuit internal substrate 10 by the wirings of the wiring layers 31, 41, and 51.

In FIG. 4, the LFSR 202 is formed by a shift register (SR) 204, and the MISR 203 is formed by an exclusive "or" circuit 205. The LFSR 202 is a circuit for generating a so-called cyclic code, and a generation polynomial of the cyclic code is decided depending on a position of the shift register 204 to which a signal of an uppermost bit of the LFSR 202 is fed back, i.e. depending on a position of the exclusive "or" circuit 205 for feedback. For example, in the LFSR 202 of FIG. 4, the exclusive "or" circuit 205 for feedback is disposed between the shift register 204 of the first bit and the shift register of the second bit. In this case, the generation polynomial is $G(x)=1+x+x^4$. Also, since the MISR 203 functions as a circuit for compressing the number system outputted from the CUT 201, a generation polynomial same as that of the LFSR 202 is defined in the MISR 203. In the case of the MISR 203 of FIG. 4, the generation polynomial is $G(x)=1+x^3+x^4$.

Second Embodiment

FIG. 5 is a diagram schematically showing a sectional structure of a testability circuit internal substrate forming a testability circuit internal SIP according to a second embodiment of this invention. In FIG. 5, components same as those of FIG. 1 are denoted by the same reference numerals, and descriptions thereof are omitted.

A testability circuit internal substrate 10b of a testability circuit internal SIP 1b according to the second embodiment is formed of three core substrates 3, 4b, and 5 that are laminated to one another as in the testability circuit internal substrate 10 according to the first embodiment. Though the structures of the core substrates 3 and 5 are the same as those of the first embodiment, the core substrate 4b in this embodiment has a base part formed of a silicon semiconductor. A transistor element such as a MOS (Metal Oxide Semiconductor) or the like is formed on the silicon semiconductor, and a plurality of wiring layers are formed on the MOS via an insulating layer. A detailed sectional structure of the core substrate 4b is omitted in this specification since the sectional structure is the same as that of an ordinary silicon semiconductor integrated circuit.

By appropriately connecting the transistor element formed by using the silicon semiconductor for the base byway of the wirings of the wiring layers formed thereabove, a testability circuit such as the boundary scanning circuit and the BIST circuit explained in FIGS. 2 to 4 is formed. The micro bump 45 is formed as required on the core substrate 4b having the silicon semiconductor base, and the testability circuit is connected to the integrated circuit chip 2 by way of connection to the core substrate 3 via the micro bump 45. The testability circuit internal SIP 1b wherein the test on the integrated circuit chip 2 is facilitated is formed as described above.

Both or either one of the core substrates 3 and 5 may be omitted in the testability circuit internal circuit 10b in FIG. 5. Also, an extra core substrate may be added to the testability circuit internal circuit 10b. The build-up layer 32 may be omitted from the core substrate 3. However, since the integrated circuit chip 2 is mounted on the core substrate 4b when the core substrate 3 is omitted, a pad for connecting the bump 21 of the integrated circuit chip 2 is formed on the core substrate 4b in place of the micro bump 45.

Since the core substrate 4b described above is produced by an ordinary silicon semiconductor production process, it is possible to embed passive elements such as a resistor, a capacitor, and inductor without limitation to the transistor element such as MOS. Also, when a process same as the nonvolatile memory production is added, it is possible to incorporate a programmable circuit element such as a PLD (Programmable Logic Device).

Accordingly, by adapting the PLD to the BIST circuit 20 (see FIG. 4), the BIST circuit 20 may be formed in such a manner that the generation polynomials of the LFSR 202 and the MISR 203 are made variable. In order to form the variable generation polynomials, the whole BIST circuit including the shift register 24 may be formed of the PLD, or the connection part of the shift register 24 and the exclusive "or" circuit 205 may be formed of the PLD while forming the shift register 24 by using an ordinary transistor element.

When the LFSR 202 and the MISR 203 are so formed that the generation polynomials are variable as described above, it is possible to adjust bit lengths of the LFSR 202 and the MISR 203 and a system length of the signal generated by the LFSR 202, and the like, according to theoretical structure of the integrated circuit chips 2 becoming an object of the test and the number of an input terminal and an output terminal. That is, by forming a part or whole of the BIST circuit using the PLD, it is possible to optimize the BIST circuit 20 in accordance with the integrated circuit chip 2 to be tested.

Though the base of the core substrate 4b of the testability circuit internal substrate 10b is formed of the silicon semiconductor in the second embodiment, a structure wherein the base is formed from an insulator such as a glass and a plastic, and a silicon semiconductor layer is formed on the insulator may be used. In this case, the transistor element such as MOS is formed by using the silicon semiconductor layer formed on the insulator. The thus-formed transistor element is often called TFT (Thin Film Transistor).

In the case of forming the TFT by forming the silicon semiconductor layer on the base such as the insulator, the semiconductor layer may be an organic compound semiconductor layer in place of the silicon semiconductor layer. FIG. 6 is a diagram showing one example of structure wherein an organic compound semiconductor is formed on a core substrate of the testability circuit internal SIP according to the second embodiment of this invention. The organic compound semiconductor shown in FIG. 6 is one example of MOS transistor using a pentacene semiconductor.

As shown in FIG. 6, in order to form the MOS transistor by the pentacene semiconductor, a silicon oxide film 502 is formed by heat oxidation or the like on a silicon substrate 501 used as abase of the core substrate 4b. A gate electrode 503 having a predetermined shape is formed on the silicon oxide film 502 by using polysilicon or the like. The gate electrode 503 is covered with an insulating film 504 such as silicon nitride, and a source electrode 505 and a drain electrode 506 having predetermined shapes are formed on the insulating film 504 by using metal layers of gold or the like. The pentacene semiconductor layer 507 is formed on an upper part of the electrodes by spin coating.

Though a structure above the pentacene semiconductor layer 507 is not shown in the drawings, wiring layers and the like are formed above the pentacene semiconductor layer 507 via an insulating layer or the like. Also, though silicon (silicon substrate 501) is used for the base of the core substrate 4b, glass or plastic may be used in place of silicon.

FIG. 7 is a diagram showing a chemical structure of a pentacene molecule. As shown in FIG. 7, the pentacene molecule has a structure wherein five so-called benzene rings are bonded.

The organic compound semiconductor described above is at present poor in reliability in terms of time degradation, i.e. has a short life. Since the testability circuit is generally used for a test during the SIP production and before dispatch of the SIP, a life of the testability circuit is sufficient when it is equal to or longer than a period from the production of SIP to termination of a final test on dispatch when the testability circuit is formed of the organic compound semiconductor. Since the period is a several weeks at the longest, the currently available organic compound semiconductor is usable.

Third Embodiment

FIG. 8 is a diagram schematically showing a sectional structure of a testability circuit internal SIP according to a third embodiment of this invention. The testability circuit internal SIP 1c shown in FIG. 8 is one example of adapting an SIP to a test board for testing a produced integrated circuit chip. In such testability circuit internal SIP 1c serving as the test board, the analog integrated circuit chip 111 for controlling or aiding the test, the digital ASIC chip 102, and the like are mounted on a testability circuit internal substrate 10c, and, further, the socket 122 for attaching the DUT (Device Under Test) 121 that is the integrated circuit chip to be tested is mounted.

In such testability circuit internal SIP 1c, too, the testability circuit for facilitating tests on the integrated circuit chips 2 such as the analog integrated circuit chip 111 mounted in the testability circuit internal circuit 10c and the digital ASIC chip 102 is incorporated into the testability circuit internal substrate 10c in the same manner as in the first and second embodiments.

Since the testability circuit internal SIP 1c is used as the test board, the signal terminal of the DUT 121 attached to the socket 122 is connected to a testing device (not shown) disposed outside the testability circuit internal SIP 1c.

FIG. 9 is a diagram wherein a point of a circuit for connecting a DUT to a testing device in the testability circuit internal circuit according to the third embodiment of this invention. As shown in FIG. 9, the impedance matching circuit 123 is added to the signal terminal of the DUT 121, and the DUT 121 is connected to the testing device via the impedance matching circuit 123. In the case of connecting the DUT 121 and the testing device to each other, impedance of the impedance matching circuit 123 is adjusted to 50Ω, for example. The impedance matching circuit 123 is ordinarily formed of a resistor and an inductor.

In this embodiment, the impedance matching circuit 123 is incorporated into the pogopin 1220 of the socket 122. As shown in FIG. 8, the pogopin 1220 of the socket 122 is provided in such a fashion that the lead 1222 and the fixing pin 1226 are fixed to the socket 122, and that the contactor 1221 contacting the signal terminal of the DUT 121 is housed in the lead 1222. In this case, a lower surface of the contactor 1221 is supported by a spring 1223, so that the contactor 1221 is pressed toward the signal terminal of the DUT 121 when the contactor 1221 and the signal terminal of the DUT 121 are brought into contact.

The lead 1222 and the fixing pin 1226 are connected to each other via a chip resistor 1224 and an inductor 1225. The chip resistor 1224 and the inductor 1225 form the impedance matching circuit 123 corresponding to the terminal signal of the DUT 121. In this case, as the inductor 1225, an inductor obtained by winding a coil around the chip resistor 1224 may be used, or a chip inductor having a shape same as that of the chip resistor 1224 may be used. As the chip resistor 1224 and the chip inductor, those having the size similar to that of the WLCSP integrated circuit 43 (see FIG. 1) are commercially available.

As described above, since the impedance matching circuit 123 corresponding to the signal terminal of the DUT 121 is incorporated into the pogopin 1220 of the socket 122 in this embodiment, it is possible to prevent signal reflection in the signal terminal of DUT 121 without increasing the size of the testability circuit internal SIP 1c.

The impedance matching circuit 123 corresponding to the signal terminal of the DUT 121 may be incorporated into the testability circuit internal substrate 10c in the same manner as in the first and second embodiments, not into the pogopin 1220 of the socket 122. Also, the impedance matching circuit 123 may be provided on the signal terminals of the analog interacted circuit chip 111 and the digital ASIC chip 102 that are mounted on the testability circuit internal substrate 10c. In the case of providing such impedance matching circuit 123, the impedance matching circuit 123 is incorporated into the testability circuit internal substrate 10c.

What is claimed is:

1. A system in package comprising a plurality of integrated circuit chips and a substrate on which the plurality of integrated circuit chips are mounted, wherein
   the substrate has a single test data input (TDI) terminal for inputting test data to the plurality of integrated circuit chips and a single test data output (TDO) terminal for outputting test data from the plurality of integrated circuit chips,
   at least one of the integrated circuit chips does not include a test-facilitating circuit, and
   at least one test-facilitating circuit is formed and embedded in/mounted on the substrate, not as a part of the integrated circuit chips, and is connected to the at least one of the integrated circuit chips in order to facilitate a test on the at least one of the integrated circuit chips using the embedded/mounted test-facilitating circuit.

2. The system in package according to claim 1, wherein the test-facilitating circuit embedded in/mounted on the substrate is a boundary scanning circuit.

3. The system in package according to claim 1, wherein the test-facilitating circuit embedded in/mounted on the substrate is a built-in self-test circuit.

4. The system in package according to claim 3, wherein at least a part of the built-in self-test circuit embedded in/mounted on the substrate is formed of a programmable circuit element.

5. The system in package according to claim 1, wherein at least one layer of the substrate is formed of a semiconductor layer constituting a metal oxide semiconductor (MOS) transistor element, and the test-facilitating circuit is formed using the transistor element.

6. The system in package according to claim 5, wherein the semiconductor layer is a silicon semiconductor layer.

7. The system in package according to claim 5 wherein the semiconductor layer is an organic compound semiconductor layer.

8. The system in package according to claim 5, wherein the substrate further comprises a passive device embedded therein/mounted thereon not as a part of the at least one integrated circuit chips, said passive device being connected to a terminal of the at least one integrated circuit chip for matching impedance of the terminal.

9. The system in package according to claim 5, wherein the transistor element is a thin film transistor (TFT).

10. The system in package according to claim 5, wherein the MOS transistor element uses a pentacene semiconductor.

11. A system in package comprising a plurality of integrated circuit chips and a substrate on which the plurality of integrated circuit chips are mounted, wherein
    at least one of the integrated circuit chips does not include a test-facilitating circuit, and
    at least one test-facilitating circuit is formed and embedded in/mounted on the substrate, not as a part of the integrated circuit chips, and is connected to the at least one of the integrated circuit chips in order to facilitate a test on the at least one of the integrated circuit chips using the embedded/mounted test-facilitating circuit,
    wherein the test-facilitating circuit embedded in/mounted on the substrate is formed using a WLCSP integrated circuit chip embedded in/mounted on the substrate.

12. The system in package according to claim 11, wherein the substrate is comprised of multiple layers extending in a lateral direction, wherein the WLCSP integrated circuit is disposed on one of the layers.

13. A system in package comprising a plurality of integrated circuit chips and a substrate on which the plurality of integrated circuit chips are mounted, wherein
    at least one of the integrated circuit chips does not include a test-facilitating circuit, and
    at least one test-facilitating circuit is formed and embedded in/mounted on the substrate, not as a part of the integrated circuit chips, and is connected to the at least one of the integrated circuit chips in order to facilitate a test on the at least one of the integrated circuit chips using the embedded/mounted test-facilitating circuit,
    wherein the substrate further comprises a socket mounted thereon, wherein an integrated circuit chip other than the integrated circuit chips mounted on the substrate is detachably attached to the socket.

14. The system in package according to claim 13, wherein the socket further comprises a passive device for matching impedance of a terminal of the integrated circuit chip attached to the socket, wherein the passive device is incorporated into a pogopin of the socket for connecting the terminal of the integrated circuit chip attached to the socket.

* * * * *